(12) United States Patent
Shao et al.

(10) Patent No.: US 10,817,018 B1
(45) Date of Patent: Oct. 27, 2020

(54) ELECTRONIC DEVICES WITH AMBIENT LIGHT SENSORS AND EMISSIVE DISPLAYS

(71) Applicant: Apple Inc., Cupertino, CA (US)

(72) Inventors: Guocheng Shao, Campbell, CA (US); Dong Zheng, Los Altos, CA (US); Christopher M. Dodson, Santa Clara, CA (US); Kenneth J. Vampola, Los Altos, CA (US); Koorosh Aflatooni, Los Altos Hills, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/398,093

(22) Filed: Apr. 29, 2019

(51) Int. Cl.
| G06F 1/16 | (2006.01) |
| G09G 3/34 | (2006.01) |
| H04N 5/378 | (2011.01) |
| H01L 27/146 | (2006.01) |

(52) U.S. Cl.
CPC .......... *G06F 1/1637* (2013.01); *G09G 3/3406* (2013.01); *H04N 5/378* (2013.01); *G09G 2320/0653* (2013.01); *G09G 2360/144* (2013.01); *H01L 27/14643* (2013.01); *H01L 2924/12043* (2013.01)

(58) Field of Classification Search
CPC ....... G09G 2360/144; G09G 2360/148; G09G 2320/0626; G09G 2320/0666; G09G 2320/0242; G09G 5/02; H04N 5/378; H01L 27/14643; H01L 2924/12043
See application file for complete search history.

(56) References Cited

U.S. PATENT DOCUMENTS

| 7,745,817 | B2 | 6/2010 | Hall et al. |
| 8,217,927 | B2 | 7/2012 | Kunimori et al. |
| 8,415,182 | B2 | 4/2013 | Cho et al. |
| 9,952,323 | B2 | 4/2018 | Deane |
| 10,129,514 | B2 | 11/2018 | Rivard et al. |
| 2006/0038758 | A1* | 2/2006 | Routley ............... G09G 3/3233 345/81 |
| 2008/0259051 | A1 | 10/2008 | Ota |
| 2011/0096009 | A1 | 4/2011 | Kurokawa et al. |

(Continued)

FOREIGN PATENT DOCUMENTS

| WO | 2012089847 | 7/2012 |
| WO | 2016067280 | 5/2016 |

*Primary Examiner* — Sanjiv D. Patel
(74) *Attorney, Agent, or Firm* — Treyz Law Group, P.C.; George Victor Treyz; Jason Tsai

(57) ABSTRACT

An electronic device may have a display with an array of pixels that display images for a user. The electronic device may have an ambient light sensor for gathering ambient light information. A subset of the pixels in the array of pixels may overlap the ambient light sensor so that ambient light passing through the subset of pixels may be measured. Each pixel may have an emission enable transistor coupled in series with a light-emitting diode. Control circuitry in the electronic device may disable the subset of pixels to reduce stray light during ambient light measurements while enabling remaining pixels in the array of pixels to display an image. Ambient light sensor circuitry may gather ambient light sensor measurements over one or more periods by using transfer transistors to transfer change from the photodetectors to charge storage capacitors formed from floating diffusions in a common substrate.

19 Claims, 11 Drawing Sheets

(56) References Cited

U.S. PATENT DOCUMENTS

| | | | |
|---|---|---|---|
| 2014/0132158 A1* | 5/2014 | Land | G09G 3/20 |
| | | | 315/152 |
| 2016/0232828 A1* | 8/2016 | Jia | G09G 3/2003 |
| 2017/0034465 A1* | 2/2017 | Hsu | H04N 5/378 |
| 2017/0092228 A1* | 3/2017 | Cote | G09G 3/3225 |
| 2017/0229059 A1* | 8/2017 | Bonnier | G06F 3/017 |
| 2019/0104296 A1 | 4/2019 | Kovacovsky et al. | |
| 2020/0066773 A1* | 2/2020 | Tashiro | H04N 5/355 |

* cited by examiner

ELECTRONIC DEVICES WITH AMBIENT LIGHT SENSORS AND EMISSIVE DISPLAYS

BACKGROUND

This relates generally to electronic devices, and, more particularly, to electronic devices with light sensors.

Electronic devices such as laptop computers, cellular telephones, and other equipment are sometimes provided with light sensors. For example, ambient light sensors may be incorporated into a device to provide the device with information on current lighting conditions. Ambient light readings may be used in controlling the device. If, for example bright daylight conditions are detected, an electronic device may increase display brightness to compensate. Color ambient light sensors can detect changes in the color of ambient light so that compensating color cast adjustments can be made to displayed content.

It can be challenging to incorporate ambient light sensors into electronic devices. If care is not taken, an ambient light sensor may consume more space in an electronic device than desired or may occupy a location that affects the shape and size of the display.

SUMMARY

An electronic device may have a display with an array of pixels that display images for a user. The electronic device may have an ambient light sensor for gathering ambient light information. The ambient light sensor may be a color ambient light sensor that gathers color ambient light information and ambient light intensity information. During operation, control circuitry in the electronic device may adjust the display based on information from the ambient light sensor. For example, the control circuitry may adjust display intensity based on ambient light intensity information and may adjust the color cast of images on the display based on ambient light color information.

A subset of the pixels in the array of pixels may overlap the ambient light sensor so that ambient light measurements may be made on ambient light passing through the subset of pixels. Each pixel may have an emission enable transistor coupled in series with a light-emitting diode. The light-emitting diode may be, for example, an organic light-emitting diode.

The control circuitry in the electronic device may disable the subset of pixels overlapping the ambient light sensor to reduce stray light during ambient light measurements while simultaneously enabling remaining pixels in the array of pixels to display an image.

Ambient light sensor circuitry may gather ambient light sensor measurements over one or more periods by using transfer transistors to transfer change from the photodetectors to charge storage capacitors formed from floating diffusions in a common substrate. Analog-to-digital converter circuitry can digitize ambient light sensor signals from the floating diffusions for use in producing digital ambient light information for adjusting the display.

DETAILED DESCRIPTION

Figure 1:
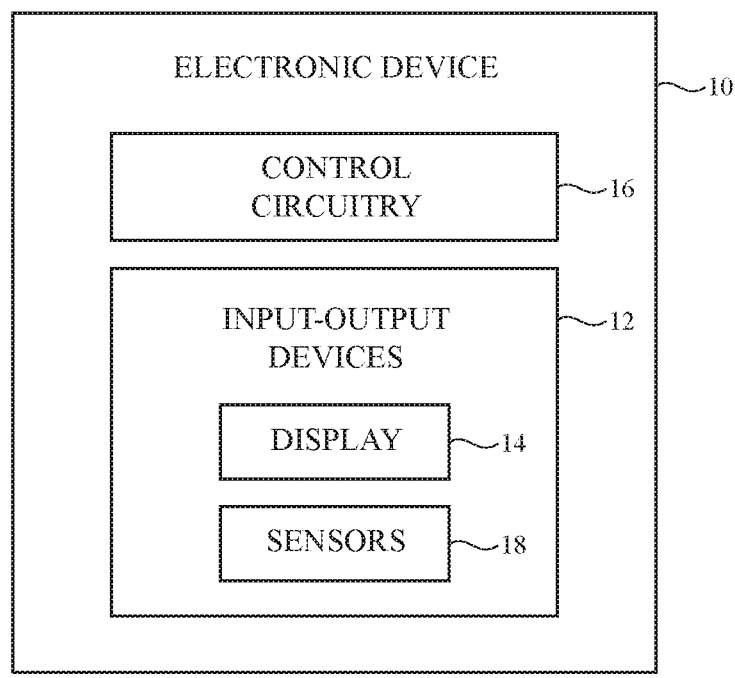
FIG. 1 is a schematic diagram of an illustrative electronic device having an ambient light sensor in accordance with an embodiment.

An illustrative electronic device of the type that may be provided with one or more optical components is shown in FIG. 1. The optical components that are included in the electronic device of FIG. 1 may include components that emit and/or detect light. In some arrangements, which may sometimes be described herein as an example, the optical components may be overlapped by portions of a display and may include optical sensors such as ambient light sensors.

Electronic device 10 of FIG. 1 may be a computing device such as a laptop computer, a computer monitor containing an embedded computer, a tablet computer, a cellular telephone, a media player, or other handheld or portable electronic device, a smaller device such as a wristwatch or other device worn on a user's wrist, a pendant device, a headphone or earpiece device, a device embedded in eyeglasses or other equipment worn on a user's head, or other wearable or miniature device, a television, a computer display that does not contain an embedded computer, a gaming device, a navigation device, an embedded system such as a system in which electronic equipment with a display is mounted in a kiosk or automobile, equipment that implements the functionality of two or more of these devices, or other electronic equipment.

As shown in FIG. 1, electronic device 10 may have control circuitry 16. Control circuitry 16 may include storage and processing circuitry for supporting the operation of device 10. The storage and processing circuitry may include storage such as hard disk drive storage, nonvolatile memory (e.g., flash memory or other electrically-programmable-read-only memory configured to form a solid state drive), volatile memory (e.g., static or dynamic random-accessmemory), etc. Processing circuitry in control circuitry 16 may be used to control the operation of device 10. The processing circuitry may be based on one or more microprocessors, microcontrollers, digital signal processors, baseband processors, power management units, audio chips, application specific integrated circuits, etc. Control circuitry 16 may include communications circuitry for supporting wired and/or wireless communications between device 10 and external equipment. For example, control circuitry 16 may include wireless communications circuitry such as cellular telephone communications circuitry and wireless local area network communications circuitry.

Input-output circuitry in device 10 such as input-output devices 12 may be used to allow data to be supplied to device 10 and to allow data to be provided from device 10 to external devices. Input-output devices 12 may include buttons, joysticks, scrolling wheels, touch pads, key pads, keyboards, microphones, speakers, tone generators, vibrators, cameras, light-emitting diodes and other status indicators, data ports, etc. A user can control the operation of device 10 by supplying commands through input-output devices 12 and may receive status information and other output from device 10 using the output resources of input-output devices 12.

Input-output devices 12 may include one or more displays such as display 14. Display 14 may be a touch screen display that includes a touch sensor for gathering touch input from a user or display 14 may be insensitive to touch. A touch sensor for display 14 may be based on an array of capacitive touch sensor electrodes, acoustic touch sensor structures, resistive touch components, force-based touch sensor structures, a light-based touch sensor, or other suitable touch sensor arrangements.

Input-output devices 12 may also include sensors 18. Sensors 18 may include a capacitive sensor, a light-based proximity sensor, a magnetic sensor, an accelerometer, a force sensor, a touch sensor, a temperature sensor, a pressure sensor, a compass, a microphone, a radio-frequency sensor, a three-dimensional image sensor, a camera, a light-based position sensor (e.g., a lidar sensor), and other sensors. Sensors 18 may also include one or more light detectors that are configured to detect ambient light. Sensors 18 may, for example, include one or more monochrome ambient light sensors and one or more color ambient light sensors that are configured to measure ambient light from the environment in which device 10 is operated. A monochrome ambient light sensor may be used to measure ambient light intensity. A color ambient light sensor may be used to measure the color (color spectrum, color temperature, color coordinates, etc.) of ambient light and may be used to measure ambient light intensity.

To make color measurements, a color ambient light sensor in device 10 may have a light detector such as a photodiode that is overlapped by a tunable wavelength filter and/or may have multiple channels each of which has a light detector such as a photodiode that is overlapped by a filter that passes a different color of light (e.g., a different wavelength band) to that light detector. By processing the readings from each of the multiple channels, the relative intensity of each of the different colors of light can be determined. Using data from the different channels in a color ambient light sensor, control circuitry 16 can therefore produce ambient light color temperature measurements and other color measurements (e.g., colors represented in color coordinates, etc.). The ambient light color information may be used by control circuitry 16 in controlling display 14 and/or in taking other actions in device 10. As an example, the color cast of images displayed on display 14 can be adjusted based on ambient light color measurement (e.g., to make the images on display 14 yellower in warm ambient lighting conditions and to make the images on display 14 bluer in cold ambient lighting conditions). If desired, display brightness may be automatically increased by control circuitry 16 in response to detection of bright ambient light conditions and may be automatically decreased by control circuitry 16 in response to detection of dim ambient light conditions.

Electronic device 10 may include one or more ambient light sensors. Illustrative arrangements in which device 10 includes a single ambient light sensor are sometimes described herein as an example. In some configurations, the ambient light sensor may be located directly under or nearly under display 14. For example, the ambient light sensor may be overlapped by a pixel array in display 14 (e.g., an active area of the display that is configured to display images). The pixel array may, as an example, form part of an emissive display such as an organic light-emitting diode display in which the pixels each contain thin-film control circuitry and an associated thin-film organic light-emitting diode that emits an adjustable amount of light. Configurations in which the pixels of the pixel array have crystalline semiconductor light-emitting diodes and/or other types of pixels with adjustable light emission levels may also be used. Arrangements in which display 14 is an organic light-emitting diode display may sometimes be described herein as an example.

During operation, control circuitry 16 can gather measurements with the ambient light sensor. Appropriate action can then be taken by control circuitry 16 in response to the ambient light sensor measurements (e.g., display color cast can be adjusted, display brightness can be adjusted, etc.).

To gather ambient light measurements, a subset of the pixels in display 14 that overlap the ambient light sensor may be momentarily disabled or otherwise selectively dimmed to avoid creating undesired stray light interference with the ambient light sensor. Simultaneously, remaining pixels in display 14 (e.g., pixels not overlapping the ambient light sensor) may be enabled to display an image for the user. With this arrangement, the ambient light sensor may make ambient light sensor measurements on ambient light that has passed from the exterior of device 10 to the ambient light sensor in an interior portion of device 10 through transparent portions of the pixel array. By locating the ambient light sensor behind the active area of the display, the appearance of device 10 may be enhanced and the amount of space consumed by the ambient light sensor may be reduced.

Figure 2:
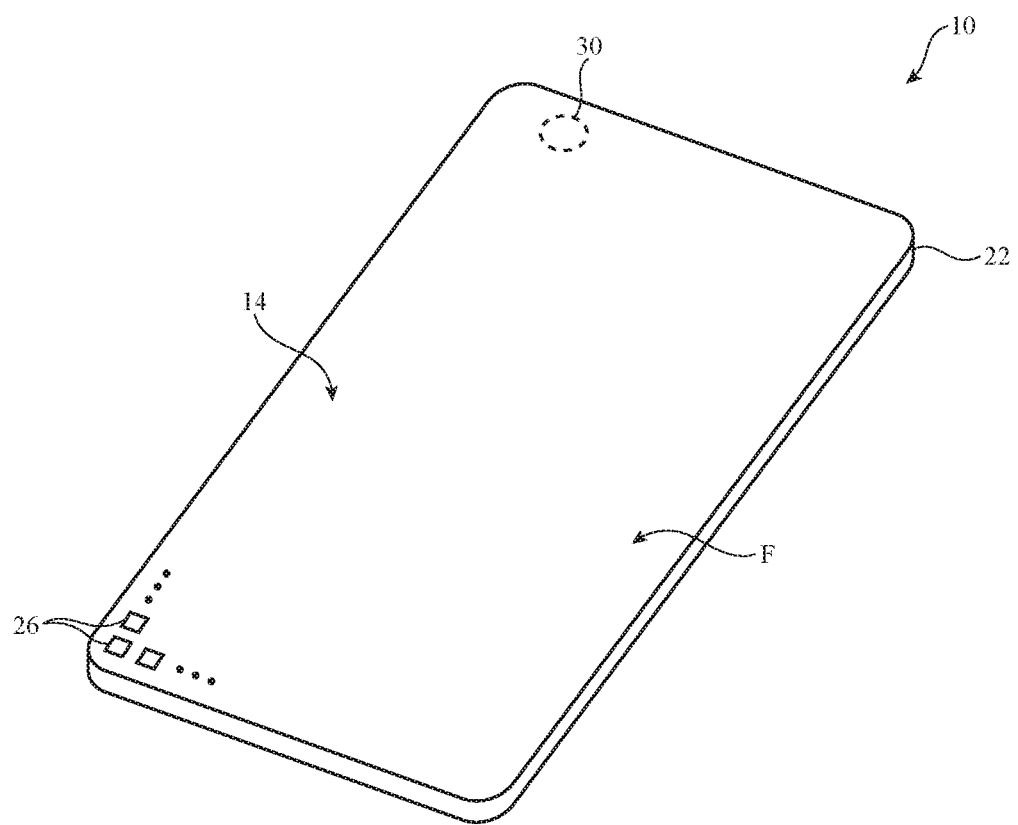
FIG. 2 is a perspective view of an electronic device with an ambient light sensor in accordance with an embodiment.

A perspective view of an illustrative electronic device of the type that may include an ambient light sensor is shown in FIG. 2. In the example of FIG. 2, device 10 includes a display such as display 14 mounted in housing 22. Display 14 may be a emissive display or other suitable display. Display 14 may have an array of pixels 26 that extend across some or all of front face F of device 10 and/or other external device surfaces. The pixel array may be rectangular or may have other suitable shapes and may contain any suitable number of rows and columns (e.g., at least 10, at least 100, at least 1,000, at least 10,000, at least 1,000,000, fewer than 500,000, fewer than 50,000, fewer than 5,000, fewer than 500, fewer than 200, etc.) Display 14 may be protected using a display cover layer (e.g., a transparent front housing layer) such as a layer of transparent glass, clear plastic, sapphire, or other clear layer. The display cover layer may overlap the array of pixels 26.

Housing 22, which may sometimes be referred to as an enclosure or case, may be formed of plastic, glass, ceramics, fiber composites, metal (e.g., stainless steel, aluminum, etc.), other suitable materials, or a combination of any two or more of these materials. Housing 22 and display 14 may separate an interior region of device 10 from an exterior region surrounding device 10. Housing 22 may be formed using a unibody configuration in which some or all of housing 22 is machined or molded as a single structure or may be formed using multiple structures (e.g., an internal frame structure, one or more structures that form exterior housing surfaces, etc.). If desired, a wristband or other strap may be coupled to a main portion of housing 22 (e.g., in configurations in which device 10 is a wristwatch).

Pixels 26 may cover substantially all of the front face of device 10 or display 14 may have inactive areas (e.g., notches, rectangular areas, or other regions) that are free of pixels 26.

The inactive areas may be used to accommodate an opening for a speaker and windows for optical components such as image sensors, an ambient light sensor, an optical proximity sensor, a three-dimensional image sensor such as a structured light three-dimensional image sensor, a camera flash, etc. In an illustrative configuration, pixels 26 may extend over front surface F of device 10 and may overlap an ambient light sensor in region 30. In this type of arrangement, ambient light may pass to the ambient light sensor in region 30 through the array of pixels 26 in display 14.

Figure 3:
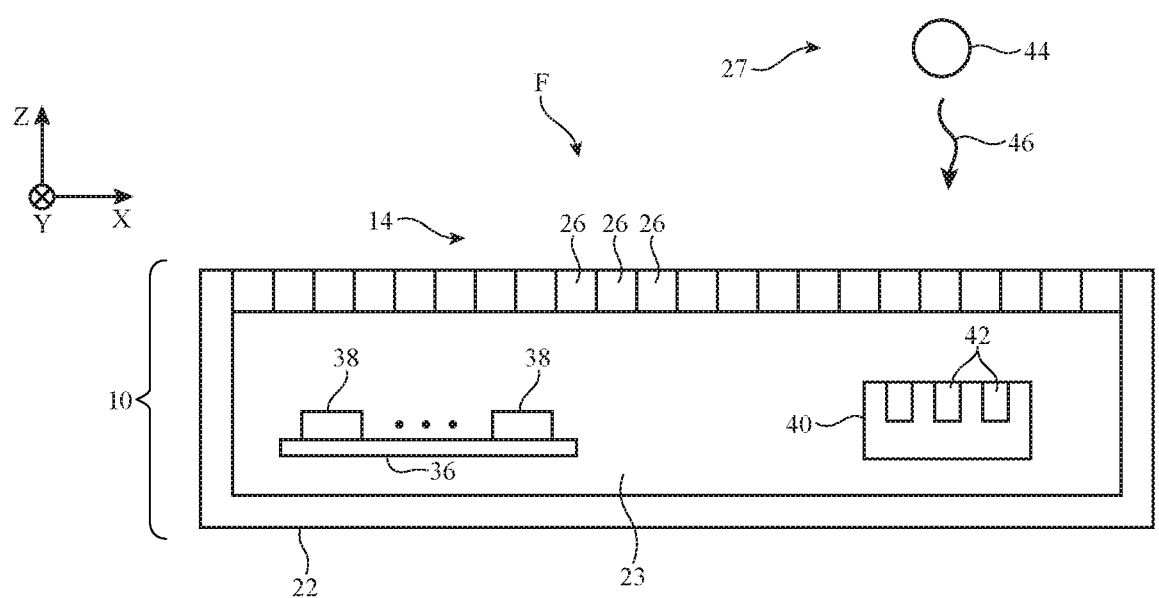
FIG. 3 is a cross-sectional side view of an illustrative electronic device with a display and ambient light sensor in accordance with an embodiment.

FIG. 3 is a cross-sectional side view of device 10 of FIG. 2 in an illustrative configuration in which pixels 26 overlap ambient light sensor 40. As shown in FIG. 3, ambient light sensor 40 may have one or more photodetectors 42. A single photodetector 42 (or set of photodetectors 42) may be used to make monochromatic light measurements (e.g., measurements of light intensity) or a set of photodetectors 42 that have color filters of different respective colors may be used to make intensity and color measurements on ambient light 46. A multi-channel ambient light sensor may, for example, have at least 2, at least 3, at least 5 at least 10, fewer than 20, or other suitable number of photodetectors 42, each of which measures light in a different band of colors. By using multiple channels of different colors in this way, ambient light sensor 40 may be used to measure the color of ambient light 46 (e.g., as color coordinates, a color temperature, etc.) as well as the overall intensity of the ambient light 46. Ambient light sensor 40 may be mounted in interior region 23 of housing 22 under display 14. Display 14 and housing 22 may separate interior region 23 from exterior region 27 surrounding device 10. Electrical components 38 (see, e.g., control circuitry 16 and input-output devices 12 of FIG. 1) may be mounted within interior region 23 (e.g., on one or more printed circuits such as printed circuit 36).

Display 14 has an array of pixels 26. Pixels 26 extend over front face F of device 10 and form an active area for display 14 in which images are displayed. A display cover layer (e.g., a layer of glass, crystalline material such as sapphire, polymer, etc.) may overlap pixels 26. Each pixel 26 may be formed from thin-film pixel circuitry including thin-film transistors, thin-film capacitor(s), and a thin-film organic light-emitting diode. Metal traces and other opaque structures in pixels 26 may block light, however, each pixel 26 also has transparent portions through which ambient light may pass. During ambient light measurements, a subset of pixels in display 14 that overlaps sensor 40 can be momentarily dimmed (e.g., disabled and thereby turned off), thereby allowing for an ambient light measurement of ambient light 46 from external light sources such as external light source 44 to be measured without stray light interference from the set of pixels. Remaining pixels in display 14 can be enabled to display an image for a user.

As the example of FIG. 3 demonstrates, ambient light sensor 40 may, in some configurations, be mounted under display 14. In this location within interior 23 of housing 22, the active area of display 14 that is formed by pixels 26 overlaps ambient light sensor 40 when viewed from the exterior of device 10 (e.g., when viewing front face F). By mounting ambient light sensor 40 behind pixels 26 in this way, the overall size of device 10 can be reduced, the appearance of device 10 may be enhanced, and inactive display area may be reduced.

Figure 4:
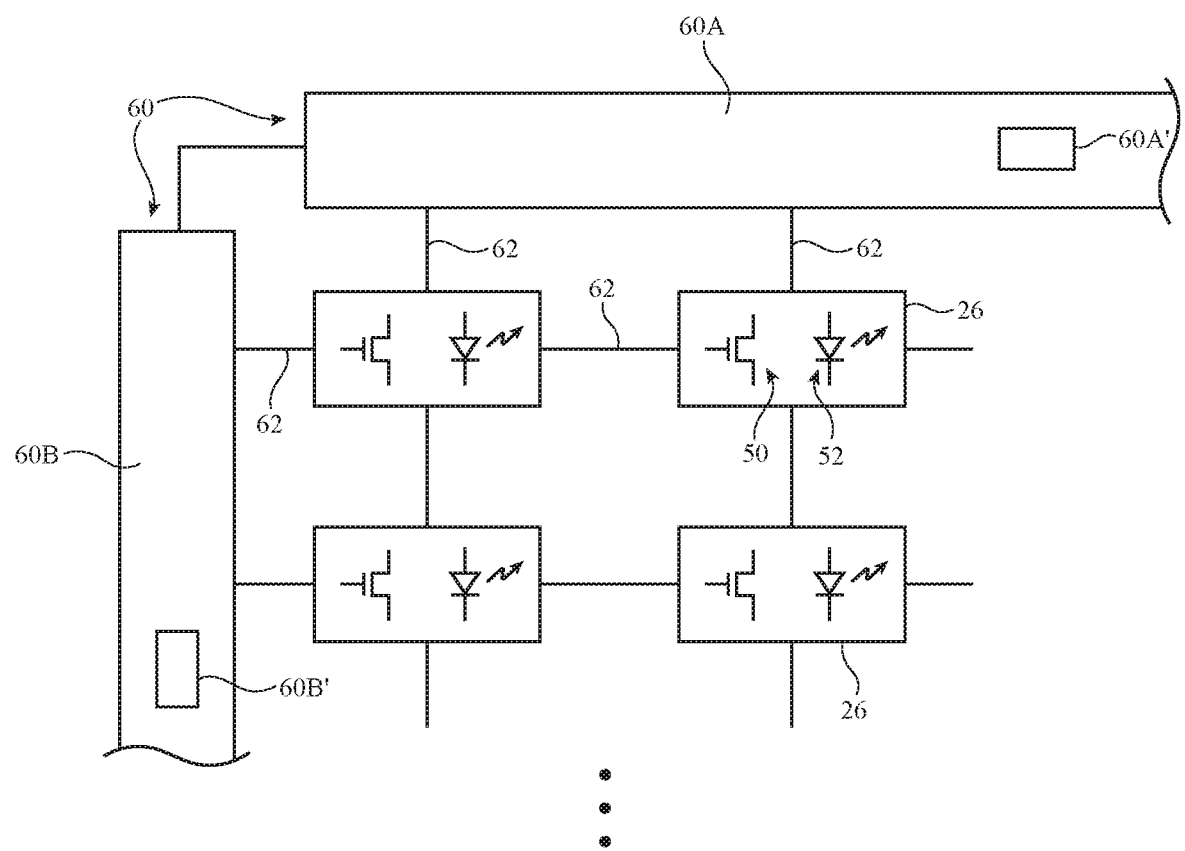
FIG. 4 is a circuit diagram of an illustrative display in accordance with an embodiment.

FIG. 4 is a circuit diagram of an illustrative display. As shown in FIG. 4, display 14 has an array of pixels 26. Each pixel 26 includes thin-film circuitry such as thin-film capacitor(s), thin-film transistors such as transistors 50, and a thin-film organic light-emitting diode 52. Display 14 has display driver circuitry 60 that controls the array of pixels 26 by supplying data and control signals over control lines 62. Control lines 62 may include, for example, vertical data lines and horizontal control lines (sometimes referred to as gate lines, emission enable lines, scan lines, etc.). Display driver circuitry 60 may include column driver circuitry 60A for supplying data to pixels 26 (e.g., over vertically extending data lines) and gate driver circuitry 60B for supplying control signals (e.g., horizontal control line signals) over horizontal control lines. If desired, a subset of pixels 26 may be controlled separately from the rest of pixels 26. For example, portion 60A' and portion 60B' of circuitry 60 may be used in controlling a set of pixels 26 that overlap an ambient light sensor. Circuitry 60 may be implemented using one or more integrated circuits and/or thin-film circuitry on a substrate shared with pixels 26.

Figure 5:
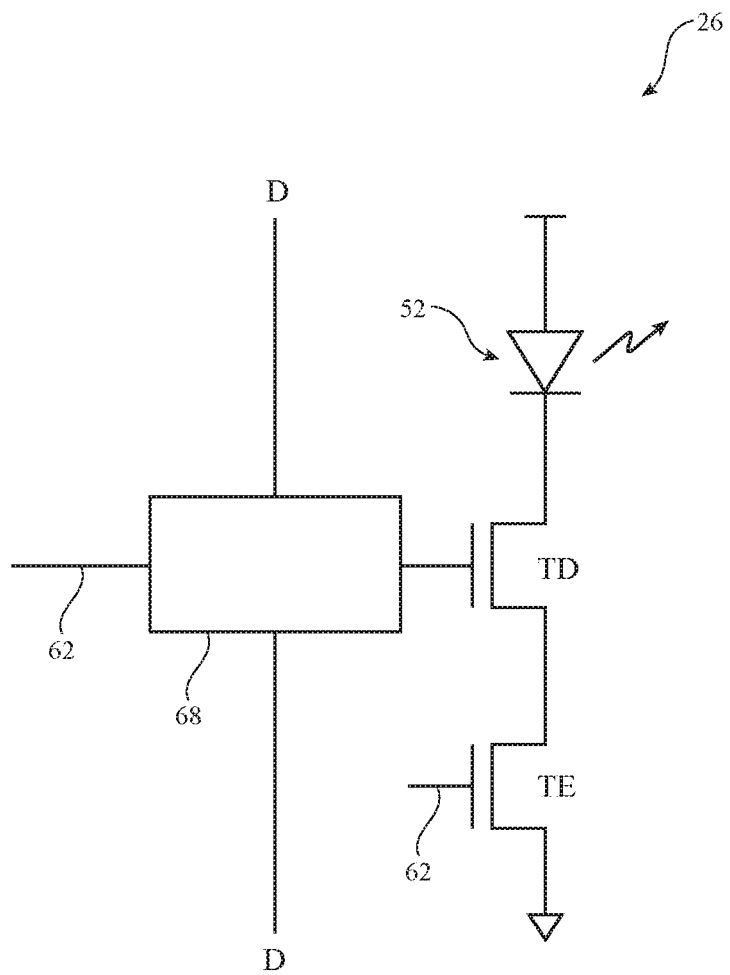
FIG. 5 is a circuit diagram of an illustrative pixel in accordance with an embodiment.

FIG. 5 is an illustrative pixel circuit for pixels 26. In the example of FIG. 5, pixel 26 includes light-emitting diode 52. Light-emitting diode 52 may be coupled in series with one or more transistors. In the example of FIG. 5, light-emitting diode 52 is coupled in series with drive transistor TD and emission enable transistor TE between a positive power supply voltage source and ground. During data loading operations, control signals are applied to lines 62 and data is supplied by circuitry 60 to data lines D and received by data loading circuit 60. Control circuitry 16 (e.g., display driver circuitry 60) deasserts the control signal on the gate of emission enable transistor TE during data loading operations. In this way, data for each pixel 26 is loaded into the data storage circuit 68 for that pixel. Following data loading operations, pixels 26 may be used to emit light to create an image. During emission operations, the control signal on the gate of emission enable transistor TE is asserted and emission enable transistor TE is turned on. The data value in data storage circuit 68 is supplied to the gate of transistor TD and controls the magnitude of the current flowing through transistor 52 and therefore the magnitude of the light emitted by light-emitting diode 52.

During ambient light sensor operations, a subset of pixels in display 14 that overlap the ambient light sensor may be turned off to reduce stray light. This set of pixels may be turned off by deasserting the control signal applied to the gates of their emission enable transistor TE. With an illustrative arrangement, control lines 62 (e.g., emission control lines for the gate of transistors TE) for the subset of pixels overlapping ambient light sensor 40 are controlled together (e.g., these control lines may be electrically shorted together) and are controlled independently of the control lines 62 that convey emission control signals to remaining pixels in display 14. This allows control circuitry 16 (e.g., circuitry 60) to turn on and off this subset of pixels independently of the remaining pixels 26 in the pixel array of display 14. Control circuitry 16 may, for example, momentarily disable the subset of overlapping pixels to reduce stray light while simultaneously enabling all remaining pixels in display 14 so that an image is simultaneously displayed for a user.

Figure 6:
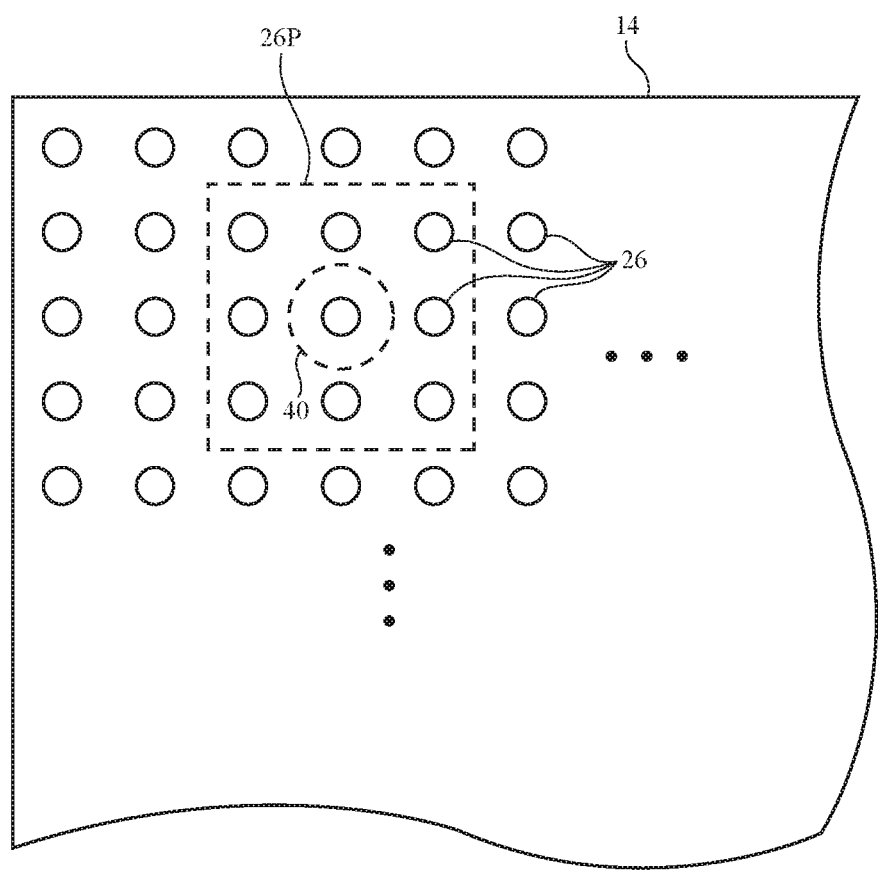
FIG. 6 is a diagram of an illustrative display showing how a subset of pixels that overlaps an ambient light sensor may be controlled independently from remaining pixels in an array of pixels in accordance with an embodiment.

FIG. 6 is a diagram of a portion of display 14 showing an illustrative subset of pixels in the array of pixels of display 14 that overlaps ambient light sensor 40. In particular, a subset of pixels in the array such as pixels 26P cover an area (e.g., a rectangular area or other contiguous areas) in the array of pixels that overlaps ambient light sensor 40.

The array of pixels 26 may include N rows (e.g. at least 10, at least 100, at least 1000, at least 10000, at least 100,000, fewer than 20,000, fewer than 5000, etc.) and M columns (e.g. at least 10, at least 100, at least 1000, at least 10000, at least 100,000, fewer than 20,000, fewer than 5000, etc.). The subset of pixels (pixels 26P) may span a contiguous subset of the rows of pixels in the array (e.g., 2-100 rows, at least 5 rows, at least 10 rows, fewer than 200 rows, fewer than 50 rows, etc.) and may span a contiguous subset of the columns of pixels in the array (e.g., 2-100 rows, at least 5 rows, at least 10 rows, fewer than 200 rows, fewer than 50 rows, etc.).

During operation, the subset of pixels overlapping light sensor 40 (e.g., pixels 26P of FIG. 6 or other suitable subset of pixels 26) may be momentarily turned off to suppress stray light while capturing an ambient light reading with sensor 40. After the ambient light reading has been captured, these pixels can again be turned on (e.g., emission may be enabled by turning on emission enable transistors TE in pixels 26P). When enabled, pixels emit light in accordance with the data stored in their data storage circuitry.

Figure 7:
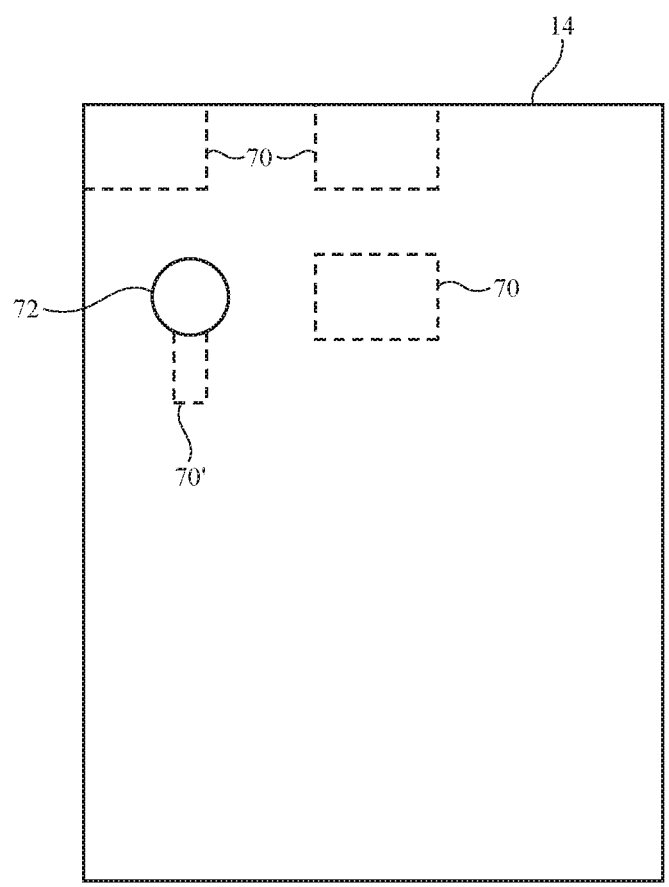
FIG. 7 is a front view of an illustrative electronic device showing illustrative locations for a subset of pixels that may be independently controlled to facilitate ambient light sensor measurements by an ambient light sensor overlapped by a display in accordance with an embodiment.

If desired, the process of enabling and disabling pixels 26P may be controlled by display driver circuits that are dedicated to the operation of pixels 26P (see, e.g., portions 60A' and 60B' of display driver circuitry 60 of FIG. 4). Any suitable number of pixels may be turned on and turned off in this way. For example, the set of pixels 26P that are turned on and off may contain at least 10 pixels, at least 100 pixels, at least 1000 pixels, at least 10,000 pixels, fewer than 20,000 pixels, fewer than 3000 pixels, fewer than 300 pixels, or fewer than 30 pixels (as examples). FIG. 7 shows illustrative locations 70 for locating ambient light sensor 40 and the associated set of pixels 26P that are selectively turned off during ambient light readings. If desired, locations 70 may include a location that touches and is therefore contiguous with camera window 72 (see, e.g., illustrative location 70').

Figure 8:
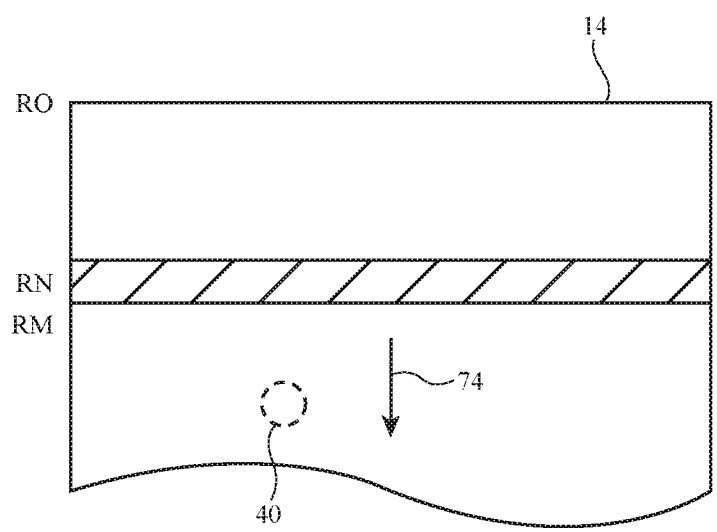
FIG. 8 is a front view of an illustrative display showing how a band of one or more dark rows of pixels may sweep past an ambient light sensor location in accordance with an embodiment.

In some configurations, a moving set of one or more lines of pixels 26 may be turned off in display 14. For example, as shown in FIG. 8, a strip of pixels including all of the pixels in rows RN to RM may be turned off (e.g., as part of a display refresh operation). The location of this strip of turned-off pixels may move down display 14 in direction 74 (e.g., the strip of pixels that are disabled may move progressively downward starting with uppermost row RO and progressing to the lowermost row of display 14. Due to the speed with which the strip of turned-off pixels moves, there may be a relatively small amount of time T (e.g., 20-500 microseconds) in which the strip overlaps ambient light sensor 40 and stray light from pixels 26 is suppressed.

Figure 9:
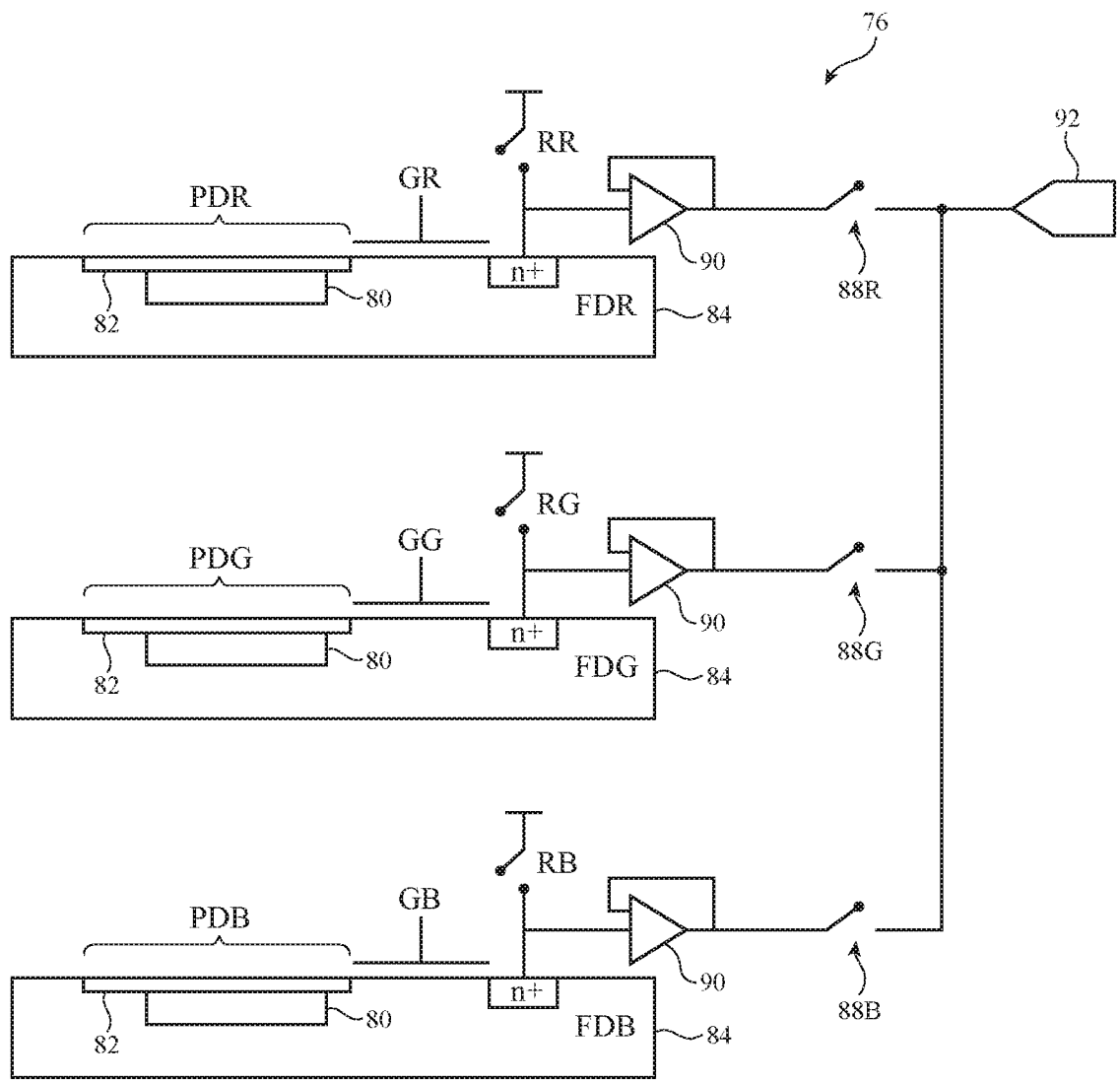
FIG. 9 is a circuit diagram of illustrative color ambient light measurement circuitry in accordance with an embodiment.

FIG. 9 is a circuit diagram of illustrative color ambient light sensor measurement circuitry 76 that may be used in capturing ambient light readings in electronic devices with scanning dark strips of pixels of the type described in connection with FIG. 8. Circuitry 76 may include ambient light sensor circuits (e.g., photodetectors such as photodiodes overlapped with color filters of different colors which exhibit different corresponding spectral sensitivities such as illustrative red photodiode PDR, green photodiode PDG, and blue photodiode PDB). These light sensor circuits may form part of a common semiconductor die (e.g., substrate 84, which may be formed from a semiconductor such as silicon) that forms ambient light sensor 40. Substrate 84 may be, for example, a p-type silicon substrate. Each photodiode may have an n-type doped region 80 and an n+ pinned diode layer in substrate 84 (e.g., the photodiodes may be pinned photodiodes) or other photodetector configurations may be used.

Each differently colored channel of the ambient light sensor may have a respective transfer transistor formed within substrate 84 adjacent to a respective one of the photodiodes. The transfer transistors have control gates. For example, the transfer transistors of FIG. 9 are controlled by gate GR for the red channel, gate GG for the green channel, and gate GB for the blue channel.

The transfer transistors are coupled between respective photodiodes and floating diffusions in substrate 84. The floating diffusions (FDR, FDG, and FDB for the red, green, and blue channels, respectively) are formed from heavily doped regions (e.g., n+ diffusions) that electrically float within respect to substrate 84 and serve as charge storage capacitors. Respective reset switches (transistors) RR, RG, and RB are each coupled in series between a power supply terminal and a respective one of the floating diffusions. The reset switches are used to remove stored charge from the floating diffusion in preparation for gathering an ambient light sensor reading.

When it is desired to make a light sensor reading, the transfer transistors are turned off and charge is gathered on the photodiodes in response to received ambient light. The gathered charge is then transferred to the corresponding floating diffusion for each channel (while the reset transistors are off) by asserting control singles on gates RR, RG, and RB and thereby turning on the transfer transistors. During charge transfer, the charge is converted to an ambient light measurement voltage. There may be a large area difference in the area occupied by photodiode area and the floating diffusion, leading to a large voltage gain for the ambient light measurement signal. For example, in a scenario in which the photodiode area is 200 microns by 1000 microns and the floating diffusion area is 200 microns by 20 microns, there may be a voltage gain of about 500 during the charge transfer process.

After charge transfer, switching circuitry such as multiplexer switches 88R, 88G, and 88B are closed in sequence to route ambient light measurement signals (voltages) from respective floating diffusions through output buffers 90 to analog-to-digital converter 92. Analog-to-digital conversion operations may be performed by converter 92 in the time period between successive ambient light sensor readings. In this way, a light sensor reading can be gathered for each differently colored channel and a corresponding ambient light color and intensity measurement can be produced. A shared analog-to-digital converter arrangement is illustrated in FIG. 9, but separate analog-to-digital converter circuits may be provided for each color channel in ambient light sensor 40, if desired.

Figure 10:
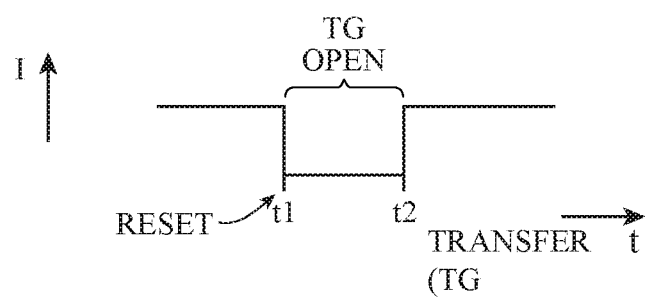
FIG. 10 is a graph showing how the color ambient light sensor circuitry of FIG. 9 may gather color ambient light sensor measurements in accordance with an embodiment.

FIG. 10 illustrates the ambient light measurement process with circuitry 76. Between times t1 and t2, display intensity I in the vicinity of ambient light sensor 40 drops as the dark strip of pixels of display 14 (e.g., the disabled set of pixels between rows RN and RM of FIG. 8) moves across and covers ambient light sensor 40, suppressing stray light. During this time, ambient light sensor 40 gathers ambient light data. In particular, at time t1, reset transistors RR, RG, and RB are closed and reset each channel. The photodiodes PDR, PDG, and PDB are then used to gather charge during the ambient light sensor measurement period between time t1 and t2. At time t2, the transfer transistors controlled by gates GR, GG, and GB are then closed to transfer the accumulated charges to respective floating diffusions FDR, FDG, and FDB. Following charge transfer, output buffers 90 and switches 88R, 88G, and 88B may supply analog-to-digital converter 92 with the voltages on the floating diffusions.

Figure 11:
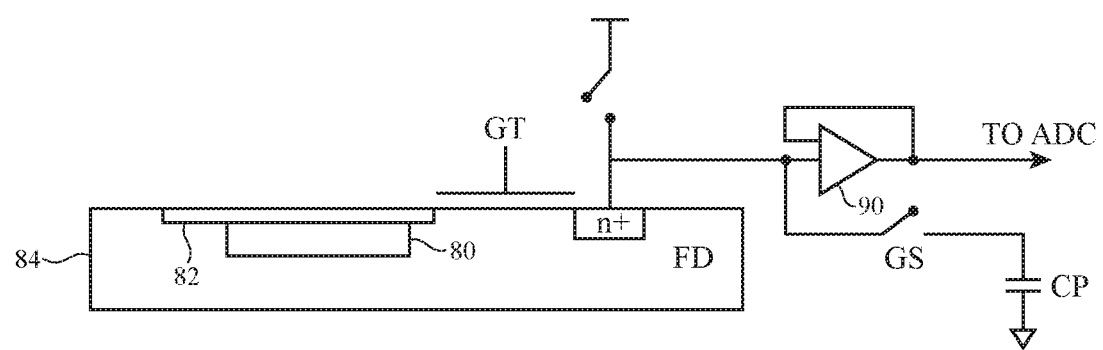
FIG. 11 is a circuit diagram of illustrative ambient light measurement circuitry in accordance with an embodiment.

As shown in FIG. 11, each color ambient light sensor channel may, if desired, have a gain selection switch (transistor) GS coupled to the floating diffusion of that channel and an associated gain adjustment capacitor CP to which gain selection switch GS is coupled. In high ambient lighting conditions (e.g., in bright outdoors conditions) it may be desirable to reduce the gain of the ambient light measurement circuitry in device 10. Accordingly, capacitors CP can be switched into use by closing switches GS. With the capacitors CP switched into use, charge transfer gain is reduced and bright signals can be measured.

Figure 12:
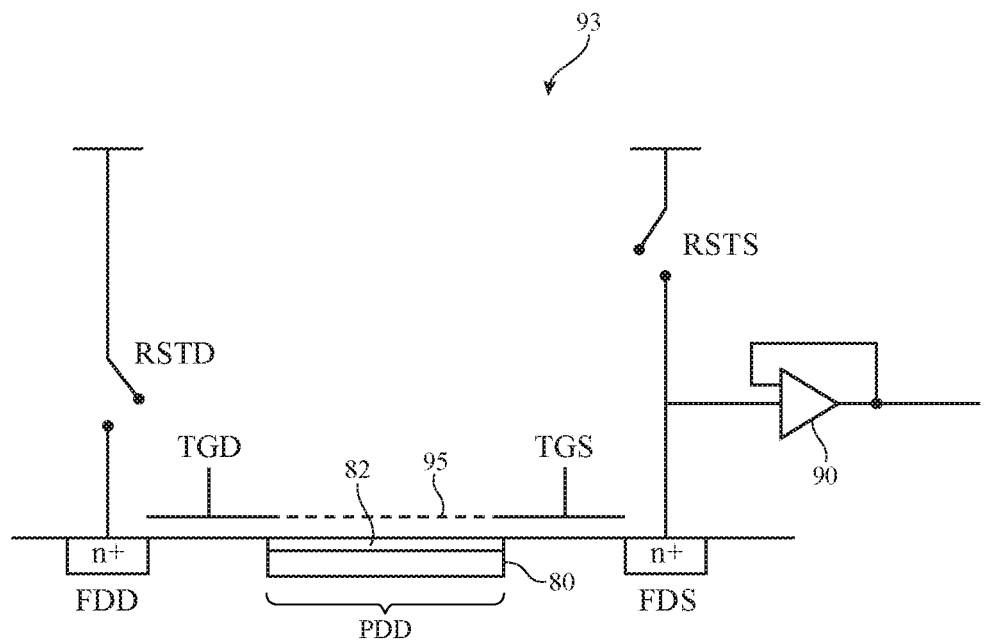
FIG. 12 is a circuit diagram of an illustrative light sensing circuit that integrates light measurements made during multiple discrete intervals in accordance with an embodiment.

FIG. 12 shows an illustrative ambient light measurement circuit that may be used to integrate photodiode measurements over multiple successive periods (e.g., multiple time periods in which a dark pixel strip moves over ambient light sensor 40). Measurement circuit 93 of FIG. 12 includes photodiode PDD. As with the photodiodes of FIG. 10, photodiode PDD may be overlapped by a color filter such as color filter 95 (e.g., colored polymer and/or a thin-film interference filter). In ambient light sensor 40, there may be multiple circuits 93 (channels) in device 10 each of which is associated with a photodiode of a different respective color (e.g., a photodiode having a different respective color filter 95 that passes a different respective range of ambient light wavelengths so that the photodiode is sensitive to ambient light in a different respective band of wavelengths). The outputs of buffer amplifiers 90 for each of these channels can be coupled by multiplexer circuitry to a common analog-to-digital converter (see, e.g., analog-to-digital converter 92 of FIG. 9) or each channel may have a separate analog-to-digital converter 92 coupled to the output of a respective buffer amplifier 90.

Circuit 93 includes floating diffusions (storage capacitors) FDD and FDS and associated transfer transistors controlled by respective gates TGD and TGS. Reset operations may be performed using switches RSTD and RSTS. Floating diffusion FDD may be used to accumulate charge from photodetector PDD over a series of different measurement periods (e.g., periods in which a dark band of pixels passes over ambient light sensor 40). When it is desired to measure the accumulated charge, the charge can be transferred to floating diffusion FDS and read out by output buffer 90 and associated analog-to-digital converter circuitry (e.g., converter 92) coupled to output buffer 90. Digital ambient light sensor information from the analog-to-digital converter circuitry can be used to make display adjustments such as color cast and/or intensity adjustments.

Figure 13:
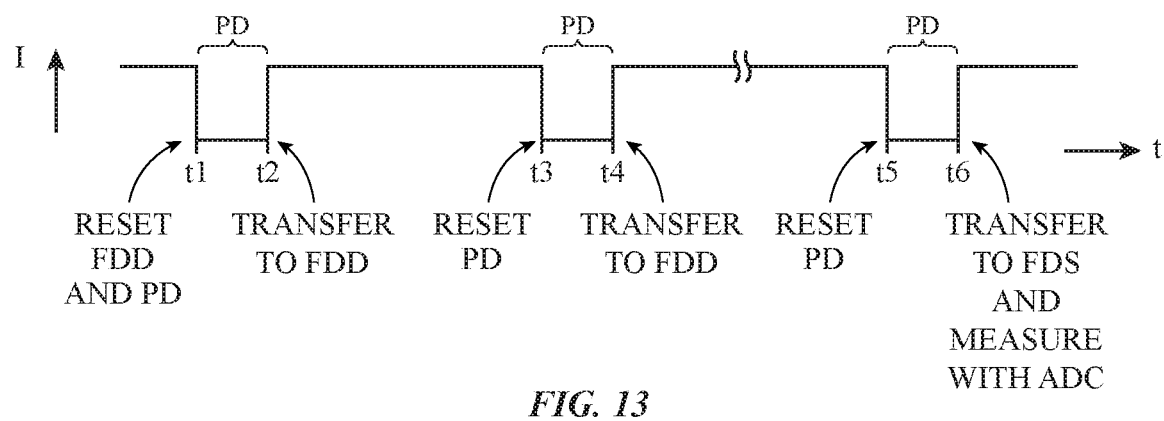
FIG. 13 is a graph showing how the circuit of FIG. 12 may be used to measure light in accordance with an embodiment.

The operation of circuit 93 of FIG. 12 may be understood with reference to the timing diagram of FIG. 13. At time t1, control circuitry 16 closes switches (transistors) RSTD and RSTS (e.g., control signals are asserted on the gates of these transistors) to reset circuit 93 in preparation for ambient light measurements while stray light is minimized (times t1 to t2). During ambient light gathering, switches RSTD and RSTS are open and control circuitry 16 asserts control signals on gates TGD and TGS to hold the transistors associated with gates TGD and TGS open. Photodiode PDD generates charge in proportion to incident ambient light. At time t2, when the dark band of pixels on display 14 begins to move past ambient light sensor 40, control circuitry 16 applies a control signal to gate TGD to close the transistor associated with gate TGD and thereby transfer the charge that is generated on photodiode PDD to floating diffusion FDD. During subsequent cycles such as at times t3 to t4, additional charge may be accumulated. For example, at time t3, gate TGS and switch RSTS may be closed to reset photodiode PDD while leaving previously accumulated charge on floating diffusion FDD and at time t4, newly gathered charge on photodiode PDD may be transferred from photodiode PDD to floating diffusion FDD. In this way, charge may be accumulated on floating diffusion FDD over a desired number of measurement cycles (e.g., 2-1000, at least 10, at least 100, fewer than 500, fewer than 50, etc.). When it is desired, to read out the value of the accumulated charge, gates TGD and TGS may be supplied with control signals to close the associated transfer transistors and thereby transfer accumulated charge from floating diffusion FDD to floating diffusion FDS, thereby allowing output buffer 90 to supply a corresponding ambient light measurement voltage to the input of the analog-to-digital converter circuitry.

Device 10 may be operated in a system that uses personally identifiable information. It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The foregoing is merely illustrative and various modifications can be made to the described embodiments. The foregoing embodiments may be implemented individually or in any combination.

Table of Reference Numerals

| | | | |
|---|---|---|---|
| 10 | Electronic device | 12 | Input-output devices |
| 14 | Display | 16 | Control circuitry |
| 18 | Sensors | 26 | Pixels |
| F | Front Face | 22 | Housing |
| 27 | Exterior region | 44 | Light source |
| 46 | Ambient light | 40 | Ambient light sensor |
| 42 | Photodiodes | 38 | Electrical components |
| 36 | Printed circuit | 23 | Interior region |
| 60 | Display driver circuitry | 60A, 60B | Portion |
| 62 | Control lines | 50 | Transistors |
| 52 | Light-emitting diodes | 60A', 60B' | Portions |
| 68 | Data storage circuit | TD | Drive transistor |
| TE | Emission enable transistor | D | Data line |
| 26P | Pixels | 70 | Locations |
| 72 | Camera window | 70' | Location |
| R0, RN, RM | Rows | 74 | Direction |
| 80 | n-type region | 82 | n+ layer |
| FDR, FDG, FDB | Floating diffusions | GR, GG, GB | Transistor gates |
| PDR, PDG, PDB | Photodiodes | RR, RG, RB | Switches (transistors) |
| 90 | Output buffers | 92 | Analog-to-digital converter |

-continued

| Table of Reference Numerals | | | |
|---|---|---|---|
| 93 | Circuit | 95 | Color filter |
| 88R, 88G, 88B | Switches | GT | Transistor gate |
| 84 | Substrate | GS | Switch |
| CP | Capacitor | RSTD, RSTS | Switches |
| TGD | Gate | TGS | Gate |
| PDD | Photodiode | PD | Photodiode integration period |

What is claimed is:

1. An electronic device, comprising:
a housing;
a display coupled to the housing that has an array of pixels with adjustable light emission levels; and
ambient light measurement circuitry comprising:
photodetectors formed in a semiconductor substrate, wherein the photodetectors are configured to gather ambient light measurements on ambient light passing through a subset of the array of pixels overlapping the photodiodes;
storage capacitors formed in the semiconductor substrate; and
transistors that are each respectively formed in the semiconductor substrate between one of the photodiodes and one of the storage capacitors.

2. The electronic device defined in claim 1 wherein the ambient light measurement circuitry comprises analog-to-digital converter circuitry configured to receive signals from the storage capacitors.

3. The electronic device defined in claim 2 wherein the storage capacitors comprise floating diffusions in the semiconductor substrate.

4. The electronic device defined in claim 3 wherein the photodetectors are configured to gather color information on the ambient light.

5. The electronic device defined in claim 4 wherein the analog-to-digital converter circuitry comprises an analog-to-digital converter having an input and wherein the ambient light measurement circuitry further comprises switching circuitry configured to selectively pass signals from each of the storage capacitors to the input.

6. The electronic device defined in claim 5 wherein the switching circuitry comprises switches and wherein the ambient light measurement circuitry comprises output buffers each coupled respectively between one of the floating diffusions and one of the switches.

7. The electronic device defined in claim 6 wherein the pixels comprise organic light-emitting diode pixels, the electronic device further comprising control circuitry configured to adjust the display based on information from the analog-to-digital converter circuitry.

8. The electronic device defined in claim 7 wherein the control circuitry is configured to disable light emission from the subset of the array of pixels when the photodetectors are gathering the ambient light measurements.

9. The electronic device defined in claim 1 further comprising gain selection switches and gain selection capacitors, wherein each gain selection switch is coupled between a respective one of the gain selection capacitors and a respective one of the storage capacitors.

10. An electronic device, comprising:
a housing;
a display coupled to the housing that has an array of pixels with adjustable light emission levels; and
ambient light measurement circuitry comprising:
a photodetector formed in a semiconductor substrate that is configured to gather ambient light measurements on ambient light passing through an area of the array of pixels overlapping the photodiode;
first and second storage capacitors formed in the semiconductor substrate;
a first transistor formed in the semiconductor substrate that is coupled between the photodetector and the first storage capacitor; and
a second transistor formed in the semiconductor substrate that is coupled between the photodetector and the second storage capacitor.

11. The electronic device defined in claim 10 further comprising analog-to-digital converter circuitry configured to receive an ambient light measurement signal from the second storage capacitor.

12. The electronic device defined in claim 11 wherein the ambient light measurement circuitry further comprises an output buffer coupled between the second storage capacitor and the analog-to-digital converter circuitry.

13. The electronic device defined in claim 12 further comprising a first reset switch coupled to the first storage capacitor and a second reset switch coupled to the second storage capacitor.

14. The electronic device defined in claim 13 further comprising control circuitry configured to control the first and second transistors and the first and second reset switches to gather integrated measurements of the ambient light over multiple measurement periods.

15. The electronic device defined in claim 14 wherein the control circuitry is configured to turn off the pixels in the area during the measurement periods.

16. An electronic device, comprising:
a housing;
an ambient light sensor in an interior region of the housing;
an array of pixels coupled to the housing, wherein a subset of the pixels in the array of pixels overlaps the ambient light sensor and wherein the ambient light sensor is configured to gather ambient light measurements on ambient light passing through the subset of pixels; and
control circuitry configured to selectively disable the subset of pixels while enabling remaining pixels in the array of pixels to prevent the subset of pixels from emitting light while the ambient light sensor is gathering the ambient light measurements and while the remaining pixels in the array of pixels are displaying an image, wherein the array of pixels has a first number or rows and a second number of columns, wherein the subset of pixels has fewer than the first number of rows and fewer than the second number of columns, and where the pixels of the array of pixels each include a light-emitting diode.

17. The electronic device defined in claim 16 wherein the control circuitry comprises display driver circuitry configured to issue first emission enable control signals for the pixels of the subset of pixels and independently adjustable second emission enable control signals for the remaining pixels in the array of pixels.

18. The electronic device defined in claim 17 wherein the light-emitting diode of each of the pixels comprises an organic light-emitting diode and wherein each of the pixels has a drive transistor and an emission enable transistor coupled in series with the organic light-emitting diode.

19. The electronic device defined in claim 18 wherein the control circuitry is configured to supply the first emission enable control signals to gates of the emission enable transistors in the subset of pixels and is configured to supply the second emission enable control signals to gates of the emission enable transistors in the remaining pixels in the array of pixels.

* * * * *

UNITED STATES PATENT AND TRADEMARK OFFICE
CERTIFICATE OF CORRECTION

PATENT NO. : 10,817,018 B1
APPLICATION NO. : 16/398093
DATED : October 27, 2020
INVENTOR(S) : Guocheng Shao et al.

It is certified that error appears in the above-identified patent and that said Letters Patent is hereby corrected as shown below:

In the Claims

In Claim 1, Column 11, Line 21, "photodetectors formed in a semiconductor substrate" should read --photodiodes formed in a semiconductor substrate--

In Claim 1, Column 11, Line 22, "wherein the photodetectors are" should read --wherein the photodiodes are--

In Claim 4, Column 11, Line 39, "photodetectors are configured" should read --photodiodes are configured--

In Claim 8, Column 11, Line 59, "when the photodetectors are" should read --when the photodiodes are--

In Claim 10, Column 12, Line 4, "a photodetector formed in" should read --a photodiode formed in--

In Claim 10, Column 12, Line 11, "between the photodetector" should read --between the photodiode--

In Claim 10, Column 12, Line 14, "between the photodetector" should read --between the photodiode--

Signed and Sealed this
Twenty-ninth Day of December, 2020

Andrei Iancu
*Director of the United States Patent and Trademark Office*